United States Patent
Kwack et al.

(10) Patent No.: US 7,692,981 B2
(45) Date of Patent: Apr. 6, 2010

(54) DATA TRANSFER APPARATUS IN SEMICONDUCTOR MEMORY DEVICE AND METHOD OF CONTROLLING THE SAME

(75) Inventors: Seung Wook Kwack, Daejeon-Shi (KR); Kwan Weon Kim, Kyungki-Do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/233,465

(22) Filed: Sep. 18, 2008

(65) Prior Publication Data

US 2009/0010082 A1    Jan. 8, 2009

Related U.S. Application Data

(63) Continuation of application No. 10/878,831, filed on Jun. 28, 2004, now Pat. No. 7,443,738.

(30) Foreign Application Priority Data

Dec. 11, 2003    (KR) ............................... 2003-89973

(51) Int. Cl.
*G11C 7/10* (2006.01)
(52) U.S. Cl. .............. 365/189.17; 365/189.05; 365/194; 365/189.011; 365/230.06
(58) Field of Classification Search ............ 365/189.05, 365/194, 189.01, 230.06, 189.17
See application file for complete search history.

(56) References Cited

U.S. PATENT DOCUMENTS

| | | | |
|---|---|---|---|
| 6,333,875 B1 | 12/2001 | Shinozaki | 365/193 |
| 6,570,944 B2 | 5/2003 | Best et al. | 375/355 |
| 6,611,475 B2 | 8/2003 | Lin | 365/233 |
| 6,661,717 B1 | 12/2003 | Gomm et al. | 365/194 |
| 6,703,879 B2 | 3/2004 | Okuda et al. | 327/158 |
| 6,768,691 B2 | 7/2004 | Kumazaki et al. | 365/198 |
| 6,850,458 B2 | 2/2005 | Li | 365/233 |
| 6,914,834 B2 | 7/2005 | Mayer | 365/201 |
| 7,443,738 B2 * | 10/2008 | Kwack et al. | 365/189.05 |
| 2002/0001360 A1 | 1/2002 | Park et al. | 375/372 |
| 2002/0091958 A1 | 7/2002 | Schoenfeld et al. | 711/100 |
| 2003/0086303 A1 | 5/2003 | Jeong | 365/189.05 |
| 2003/0221050 A1 | 11/2003 | Hong et al. | 711/105 |
| 2004/0056697 A1 | 3/2004 | Partsch et al. | 327/233 |
| 2004/0095838 A1 | 5/2004 | Li | 365/233 |
| 2004/0100856 A1 | 5/2004 | Ootsuki | 365/233 |
| 2004/0123207 A1 | 6/2004 | Zumkehr et al. | 714/744 |

* cited by examiner

*Primary Examiner*—Thong Q Le
(74) *Attorney, Agent, or Firm*—Marshall, Gerstein & Borun LLP

(57) ABSTRACT

A data transfer apparatus in a semiconductor memory device includes a DQ pad, a DQS pad, a DQ driver for transferring the data signal to the DQ pad according to a driver select signal, and a DQS driver for transferring data strobe signal to the DQS pad according to the driver select signal. Any one of the DQ driver and the DQS driver is activated by the driver select signal, and the driver select signal is generated by one of EMRS control code, MRS control code and test mode code.

9 Claims, 2 Drawing Sheets

DATA TRANSFER APPARATUS IN SEMICONDUCTOR MEMORY DEVICE AND METHOD OF CONTROLLING THE SAME

CROSS REFERENCE TO RELATED APPLICATIONS

This application is a continuation of U.S. patent application Ser. No. 10/878,831 entitled "Data Transfer Apparatus in Semiconductor Memory Device and Method of Controlling the Same," filed Jun. 28, 2004, the contents of which are expressly incorporated by reference herein.

FIELD OF THE INVENTION

The present invention relates to a data transfer apparatus in a semiconductor memory device for a high speed operation, and more particularly to, an apparatus of controlling data and a data strobe driving signal in a semiconductor memory device and a method of controlling the same, capable of adjusting a setup/hold time of a system by separately controlling data and a data strobe driver.

DISCUSSION OF RELATED ART

As a high speed operation memory has been required, it has become a trend that a minimum data deciding time of a data setup/hold time, which has not been a problem in a low speed operation memory, is being decreased by hundreds ps (pico second). The condition makes it difficult to decide data in a high speed operation memory. Actually, a DRAM drives data DQ and a data strobe DQS by the same strength and a system receiving the data inputted by the DRAM uses the DQS as a reference signal to receive the data.

After constructing a system, the system gets a setup/hold time inherently. During this, once the setup/hold time is set, it is seriously difficult to vary it in the system.

In general, it is possible in a low speed operation to transfer a sufficient data by the setup/hold time which has once set, but there may be a problem in a high speed operation. Therefore, it is occurred to reset the setup/hold time in the high speed operation.

Accordingly, if the system which has set causes a trouble, the data and the data strobe strengths are controlled at the same time. It will be described about this conventional art with reference to FIG. 1.

An inputted data signal is driven by a DQ driver 10 and transferred to a DQ pad 30 according to a data strobe signal passed through a delay stage.

In addition, the data strobe signal is driven by a DQS driver 20 and then transferred to a DQS pad 40. The side of receiving the data signal receives the data signal according to the data strobe signal supplied from the DQS pad 40.

As the DQ driver 10 and the DQS driver 20 are controlled by the data strobe signal identically inputted to the drivers at the same time, the conventional art can be impossible to control a data signal at the side of receiving it and an arriving time of a data strobe signal for a receiving reference of the data, separately. As a result, in case of the system which has already set, it is also impossible to minutely control the setup/hold time of the data signal and the data strobe signal.

SUMMARY OF THE INVENTION

The present invention is directed to provide a circuit for controlling data and a data strobe driver in a semiconductor memory device and a method of controlling the same, capable of separately controlling an arriving time at the side of receiving a data signal by separately adjusting drivers of a DQ and a DQS.

One aspect of the present invention is to provide a circuit for controlling data and a data strobe driver in a semiconductor memory device, comprising: a first delay unit for outputting a data signal with a variable delay; a DQ driver for outputting a data signal according to the data signal passed through the first delay unit and a driver select signal; a second delay unit for outputting a data strobe signal with a variable delay; and a DQS driver for outputting the data strobe signal passed through the second delay unit by being driven according to the driver select signal.

Here, a method of controlling data and a data strobe driver in a semiconductor memory device according to the present invention, in order to achieve the aforementioned object, comprises the steps of: generating a first control signal for selecting a DQ driver or a DQS driver; generating a second control signal for delaying a strobe signal by using a plurality of delay paths; and controlling an output time of data of the DQ driver or the DQS driver selected in response to the first control signal by means of the strobe signal delayed by the second control signal.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Hereinafter, it will be described about embodiments in accordance with the present invention with reference to the accompanying drawings.

Figure 1:
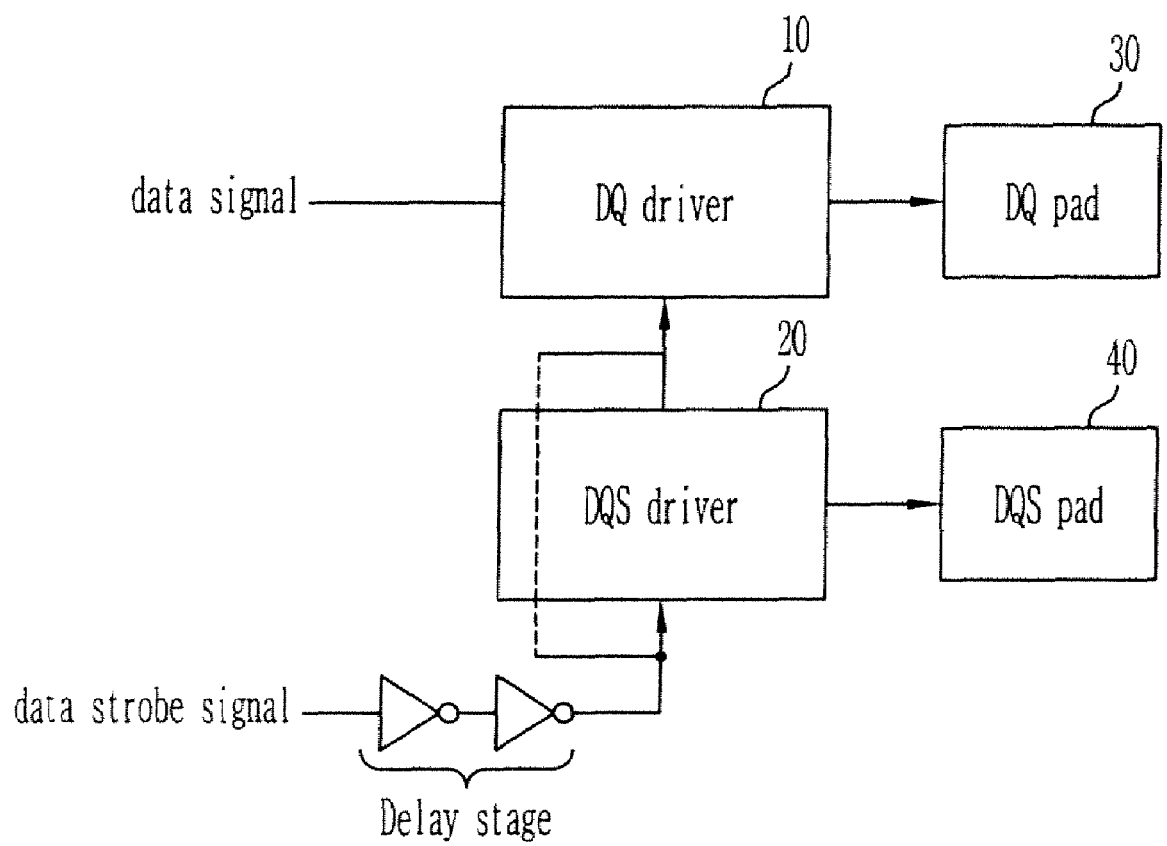
FIG. 1 is a block diagram illustrating controlling data and a data strobe signal in a semiconductor memory device of the conventional art.
Figure 2:
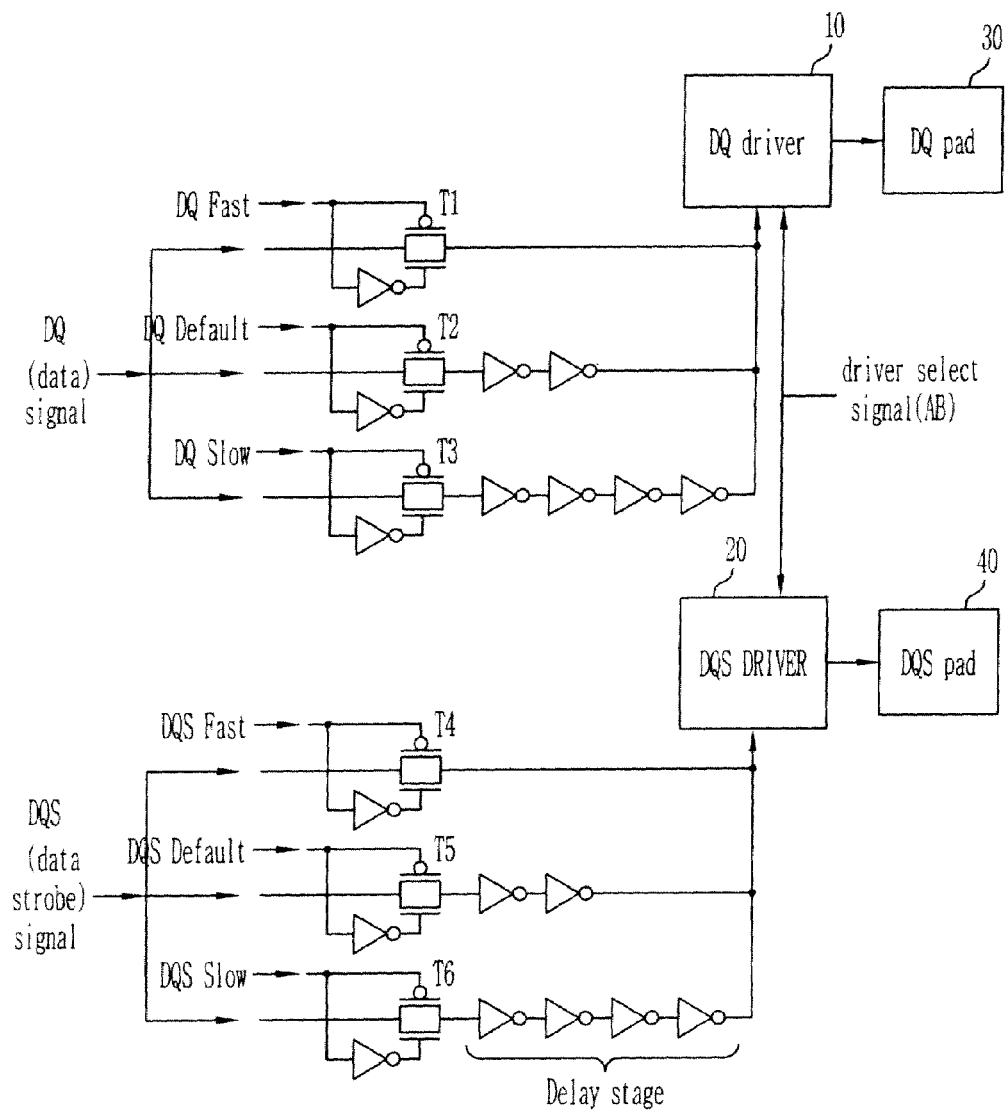
FIG. 2 is a block diagram illustrating controlling data and a data strobe signal in accordance with the present invention.

FIG. 2 is a block diagram illustrating controlling data and a data strobe signal in a semiconductor memory device in accordance with the present invention.

The present invention divides a data strobe signal into fast, default, and slow modes by using an extended mode register set EMRS code and then provides it into a DQ driver 10 and a DQS driver 20.

For instance, control codes A1, A2 of the EMRS decide which delay time will be used. That is, fast, default, and slow modes are decided by the control codes A1, A2 of the EMRS. Furthermore, an EMRS code A3 selects the DQ driver or the DQS driver.

The present invention explains the embodiment by using the EMRS control signals of the EMRS circuit as an example, but it can be replaced with a mode register set MRS control code or a test mode control code. That is, any other code may be used for replacing the control codes A1, A2, A3.

For instance, although the DQ and the DQS are driven at the same time but the DQS gets later than the DQ at an arriving time in a receiving terminal of a real system, which may cause a problem. In this case, there hasn't been no way to solve the problem in the conventional art. However, the present invention can manage the aforementioned problem by transferring the DQS faster than the DQ in this case.

It will be explained of the present invention with reference to following Tables. 1 and 2 in detail.

TABLE 1

| A | A2 | Control mode |
|---|----|--------------|
| 0 | 1  | Default      |
| 1 | 0  | Slow         |
| 1 | 1  | Fast         |

TABLE 2

| A3 | Select driver |
|----|---------------|
| 0  | DQ driver     |
| 1  | DQS driver    |

Table 1 shows a logic state of the EMRS control codes A1, A2. That is, when the A1 and A2 are 0 and 1, respectively, it means a default mode which enables a DQ default signal and a DQS default signal. When the A1 and A2 are 1 and 0, respectively, it means a slow mode which enables a DQ slow signal and a DQS slow signal. When the A1 and A2 are 1 and 1, respectively, it means a fast mode which enables a DQ fast signal and a DQS fast signal.

Table 2 shows a logic state of the EMRS control code A3. When the A3 is 0, the DQ driver 10 is selected and when the A3 is 1, the DQS driver 20 is selected.

That is, when the DQ driver 10 is selected and it is a fast mode, a transmission gate T1 is turned on, to supply a data signal to the DQ driver 10 without a delay. When the DQ driver 10 is selected and it is a default mode, a transmission gate T2 is turned on and then the data signal is delayed by two inverters connected each other in series, to supply it to the DQ driver 10. When the DQ driver 10 is selected and it is a slow mode, a transmission gate T3 is turned on and then the data signal is delayed by four inverters connected in series, to supply it to the DQ driver 10.

Furthermore, when the DQS driver 20 is selected and it is a fast mode, a transmission gate T4 is turned on, to supply the data strobe signal to the DQS driver 20 without a delay. When the DQS driver 20 is selected and it is a default mode, a transmission gate T5 is turned on and then the data strobe signal is delayed by two inverters connected each other in series, to supply it to the DQS driver 20. When the DQS driver 20 is selected and it is a slow mode, a transmission gate T6 is turned on and then the data strobe signal is delayed by four inverters connected in series, to supply it to the DQS driver 20.

For instance, in condition that the DQ and DQS are driven at the same time but there is a problem because the DQS is arrived later than the DQ at an arriving time in a receiving terminal of a real system, if the DQS driver 20 is selected by the A3 code and the EMRS control codes A1, A2 get 1 and 1, respectively, in a fast mode, the transmission gate T4 is turned on. Therefore, the data strobe signal is supplied to the data DQS driver 20 without a delay. As a result, the data strobe signal is transferred faster than before.

As aforementioned, the DQ driver 10 and the DQS driver 20 are separately controlled and the selected driver controls an output time by adjusting a delay time of the data strobe control signal. That is, the delay time of the data strobe signal controls the data at the side of receiving data and an arriving time of the data strobe signal as a reference signal to receive the data. As a result, the setup and hold time are controlled thereto.

The outputted data signal and the data strobe signal can separately control an arriving time at the side of receiving the data.

As described earlier, the present invention can assure stabilization of data transfer by controlling the DQ signal and DQS signal, respectively, according to a delay time of the strobe signal inputting the setup and hold time of the system to the DQ and DQS drivers Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A data transfer apparatus in a semiconductor memory device, comprising:
   a DQ pad;
   a DQS pad;
   a DQ driver for transferring the data signal to the DQ pad according to a driver select signal; and
   a DQS driver for transferring the data strobe signal to the DQS pad according to the driver select signal,
   wherein, if the data strobe signal arrives later than the data signal, the data strobe signal is transferred faster than the data signal.

2. The data transfer apparatus in the semiconductor memory device of claim 1, further comprising:
   a first delay unit for adjusting a delay time of a data signal in response to control signals;
   a second delay unit for adjusting a delay time of a data strobe signal in response to the control signals.

3. The data transfer apparatus in the semiconductor memory device of claim 2, wherein the first and second delays unit each have a different number of delay paths.

4. The data transfer apparatus in the semiconductor memory device of claim 2, wherein the control signals include an EMRS control code.

5. The data transfer apparatus in the semiconductor memory device of claim 2, wherein the control signals include a MRS control code.

6. The data transfer apparatus in the semiconductor memory device of claim 2, wherein the control signals include a test mode code.

7. The data transfer apparatus in the semiconductor memory device of claim 2, wherein each of the first and second delay unit is comprised of first, second, and third delay paths,
   wherein a delay time of the first delay path is shorter than a delay time of the second delay path, and the delay time of the second delay path is shorter than a delay time of the third delay path.

8. The data transfer apparatus in the semiconductor memory device of claim 1, wherein any one of the DQ driver and the DQS driver is activated by the driver select signal.

9. The data transfer apparatus in the semiconductor memory device of claim 8, wherein the driver select signal is generated by one of EMRS control code, MRS control code and test mode code.

* * * * *